(12) United States Patent  
Magri' et al.

(10) Patent No.: US 7,560,368 B2  
(45) Date of Patent: Jul. 14, 2009

(54) INSULATED GATE PLANAR INTEGRATED POWER DEVICE WITH CO-INTEGRATED SCHOTTKY DIODE AND PROCESS

(75) Inventors: Angelo Magri', Belpasso (IT); Ferruccio Frisina, Sant'Agata Li Battiati (IT)

(73) Assignee: STMicroelectronics, S.r.l., Agrate Brianza (MI) (IT)

( * ) Notice: Subject to any disclaimer, the term of this patent is extended or adjusted under 35 U.S.C. 154(b) by 95 days.

(21) Appl. No.: 11/520,210

(22) Filed: Sep. 12, 2006

(65) Prior Publication Data  
US 2007/0102725 A1     May 10, 2007

Related U.S. Application Data

(62) Division of application No. 10/713,778, filed on Nov. 14, 2003, now abandoned.

(30) Foreign Application Priority Data  
Nov. 14, 2002  (EP) .................................. 02425695

(51) Int. Cl.  
*H01L 21/28*  (2006.01)

(52) U.S. Cl. ........ 438/570; 257/E29.13; 438/FOR. 335

(58) Field of Classification Search ................. 428/197, 428/FOR. 335; 257/E21.359, E21.368  
See application file for complete search history.

(56) References Cited

U.S. PATENT DOCUMENTS

| 4,823,172 | A   |    | 4/1989  | Mihara ........................ 357/15 |
| 5,528,058 | A   |    | 6/1996  | Pike et al. .................... 257/142 |
| 5,886,383 | A   |    | 3/1999  | Kinzer ....................... 257/341 |
| 6,140,214 | A   | *  | 10/2000 | Violette et al. .............. 438/525 |
| 6,724,039 | B1  | *  | 4/2004  | Blanchard .................... 257/328 |

* cited by examiner

*Primary Examiner*—Brook Kebede  
*Assistant Examiner*—Tony Tran  
(74) *Attorney, Agent, or Firm*—Graybeal Jackson LLP (57) ABSTRACT

A process for integrating a Schottky contact inside the apertures of the elementary cells that constitute the integrated structure of the insulated gate power device in a totally self-alignment manner does not requires a dedicated masking step. This overcomes the limits to the possibility of increasing the packing density of the cellular structure of the integrated power device, while permitting improved performances of the co-integrated Schottky diode under inverse polarization of the device and producing other advantages. A planar integrated insulated gate power device with high packing density of the elementary cells that compose it, having a Schottky diode electrically in parallel to the co-integrated device, is also disclosed.

2 Claims, 13 Drawing Sheets

Schottky window = 2*SL − L = 2*h*$ta$ (tilt) − L

INSULATED GATE PLANAR INTEGRATED POWER DEVICE WITH CO-INTEGRATED SCHOTTKY DIODE AND PROCESS

PRIORITY CLAIM

This application is a Divisional of U.S. application Ser. No. 10/713,778 which was filed on Nov. 14, 2003, now abandoned which claims priority from European Patent Application No. 02425695.0, filed on Nov. 14, 2002, is incorporated herein by reference.

TECHNICAL FIELD

The invention relates generally to insulated gate planar integrated power devices and in particular to devices to which are associated a power diode integrated on the same chip.

BACKGROUND

Insulated gate devices, such as MOSFETs in particular, are used in many applications as synchronous rectifiers. In this case, the insulated gate device operates as a diode: it is turned on when the equivalent diode must be in conduction and is turned off when the diode must stop conducting.

This happens for example in output bridge stages in DC-DC converter applications.

In these applications, the intrinsic bipolar diode (body-drain junction) is switched, but such an intrinsic diode is inefficient because:

it switches slowly;

it has a high conduction voltage;

it may generate EMI in the board and this limits the efficiency of the whole system.

In order to reduce the switching time or more precisely the reverse recovery time of the diode (trr), techniques for controlling the life time of minority carriers are generally used. The introduction in the semiconductor substrate of the device of Au, Pt, or other elements by ion implantation, or irradiation with electrons, produces a marked decrease of the life time (from tens of microseconds to tens of nanoseconds) with consequent reduction of the trr of the intrinsic or internal diode. In any case, the reduction of the trr is accompanied by an increase of the conduction voltage (Vf) and of the output resistance (Ron) of the insulated gate device that limits the usefulness of such techniques.

Moreover, these techniques amplify or do not reduce the problems due to a too fast recovery of the diode and thus to the emissions of electromagnetic interferences (EMI) on the board. In order to improve softness, more complex alternative techniques are needed.

A known approach is that of using a Schottky diode of the same voltage and of appropriate area, in parallel to the internal PN junction diode of the integrated structure of the insulated gate device (for example a power MOS transistor or briefly PMOS).

Because of the absence of minority carriers, the Schottky diode is characterized by a fast recovery and, because of the different barrier heights, it has lower conduction voltages. In fact, for voltages lower than 0.9V the Schottky diode conducts a larger current than a PN junction diode; for higher voltages, the characteristics become similar and the PN diode finally conducts a larger current, because of the modulation of its conductivity.

Therefore, the parallel of a junction diode and a Schottky diode produces an equivalent device with the following characteristics:

reduced Vf at relatively low current levels (<0.8V);

less stored charge and thus reduction of the switching time.

Figure 1:
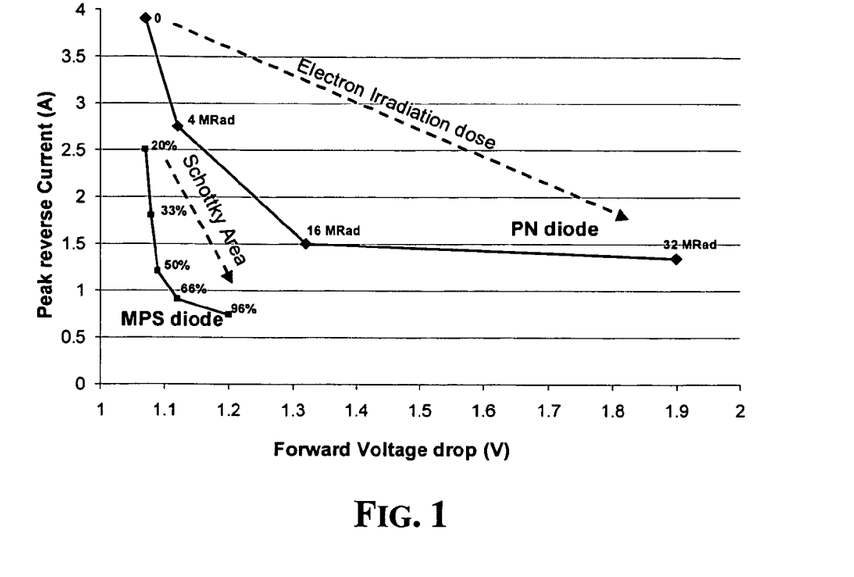
FIG. 1 shows the experimental trade-off curve between the voltage Vf and the inverse current peak of a switching MPS diode, with an irradiated PN junction diode in function of the area reserved to the Schottky diode.

FIG. 1 illustrates the advantage of a combined diode MPS (Merged PN Schottky) in respect to a normal junction diode.

The experimental trade-off curve between Vf and the inverse current peak during the switching of a MPS diode upon varying the area of the Schottky diode and when the control of the life time in a PN diode has been obtained by irradiating the junction with high energy electrons (3 MeV) at doses comprised between 0 and 32 MRad.

Figure 2:
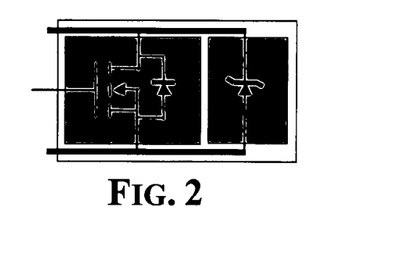
FIG. 2 depicts a solution with discrete elements combined in a single package.

Nowadays, various Schottky diode configurations, in parallel with the intrinsic diode of the PMOS structure are implemented in planar devices to be used in the low voltage range (320-150 V): that is from the simplest architecture that uses a single package but separate devices (discrete solution) depicted in FIG. 2, to more complex architectures that integrate the Schottky diode in the PMOS structure itself.

Figure 3:
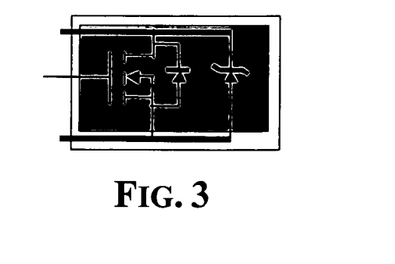
FIG. 3 depicts a monolithic solution with distinct areas for the PMOS and the Schottky diode.

Among known "integrated" solutions, there is the one shown in FIG. 3, according to which a separated area (on the same chip) is dedicated for the Schottky diode. However, this solution has limitations and drawbacks, as will be explained later.

Figure 4:
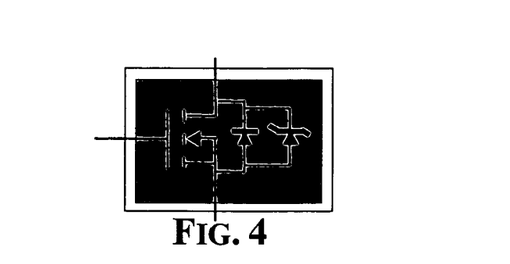
FIG. 4 depicts an integrated solution of a Schottky diode in each elementary cell of the PMOS, according to the prior art.
Figure 5:
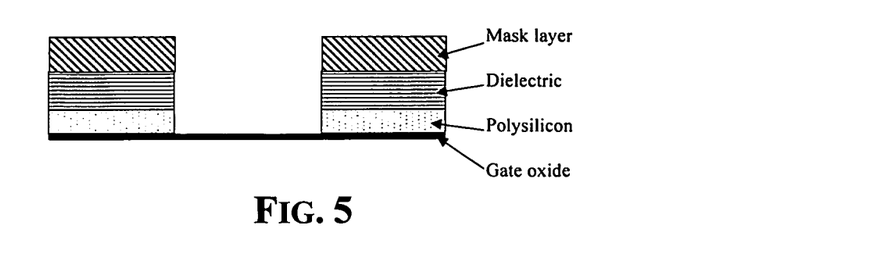
Figure 6:
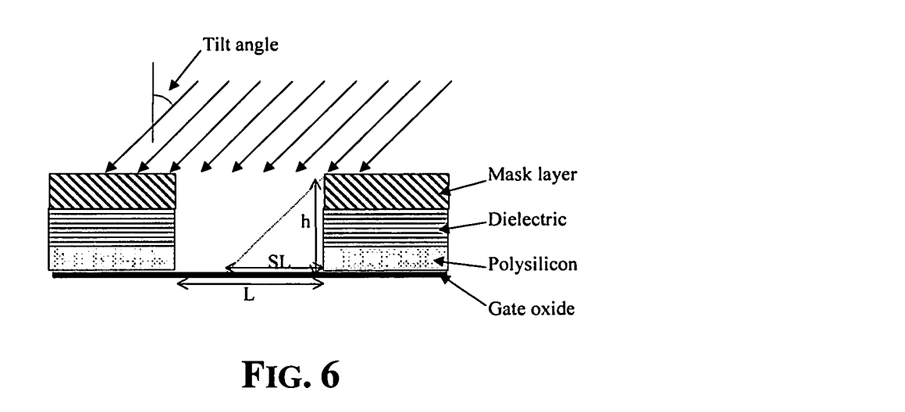
Figure 7:
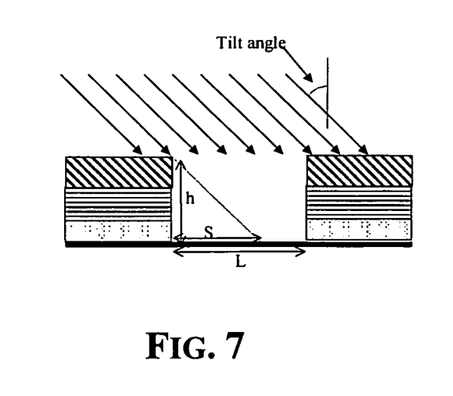
Figure 8:
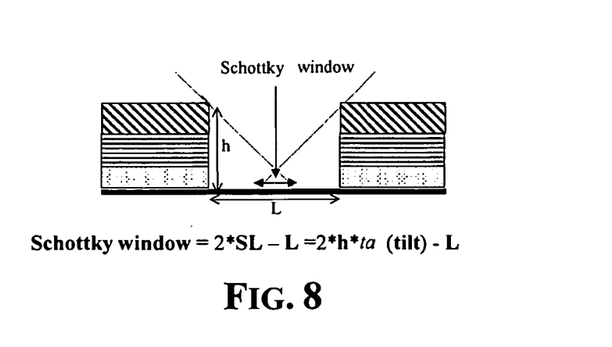
Figure 9:
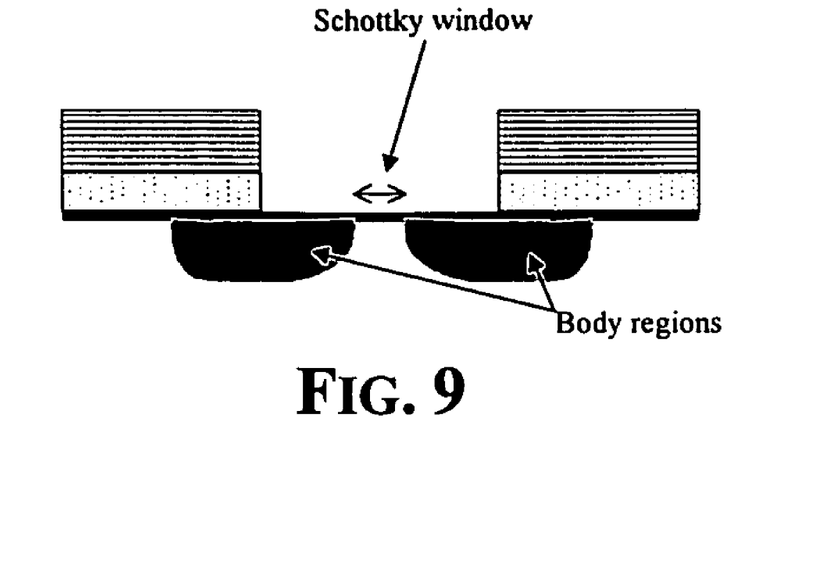
Figure 10:
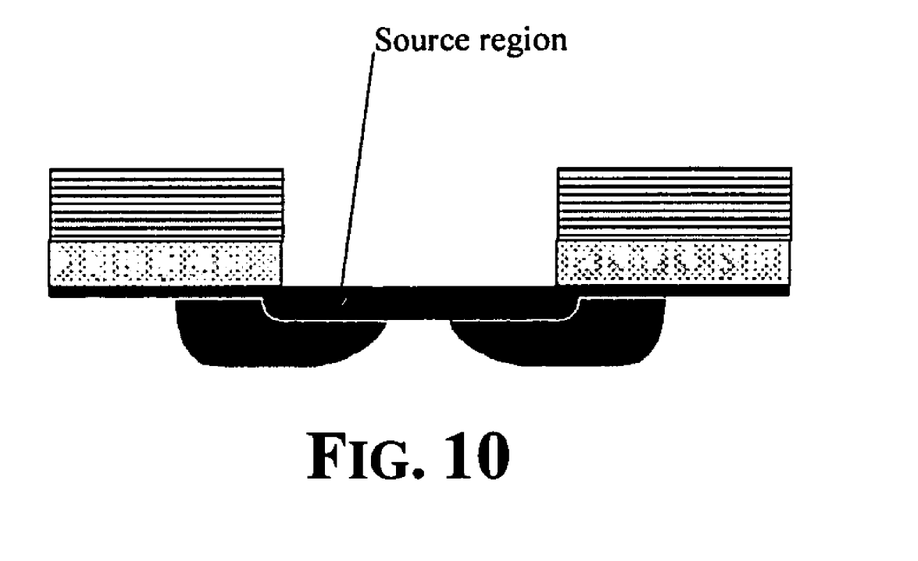
Figure 11:
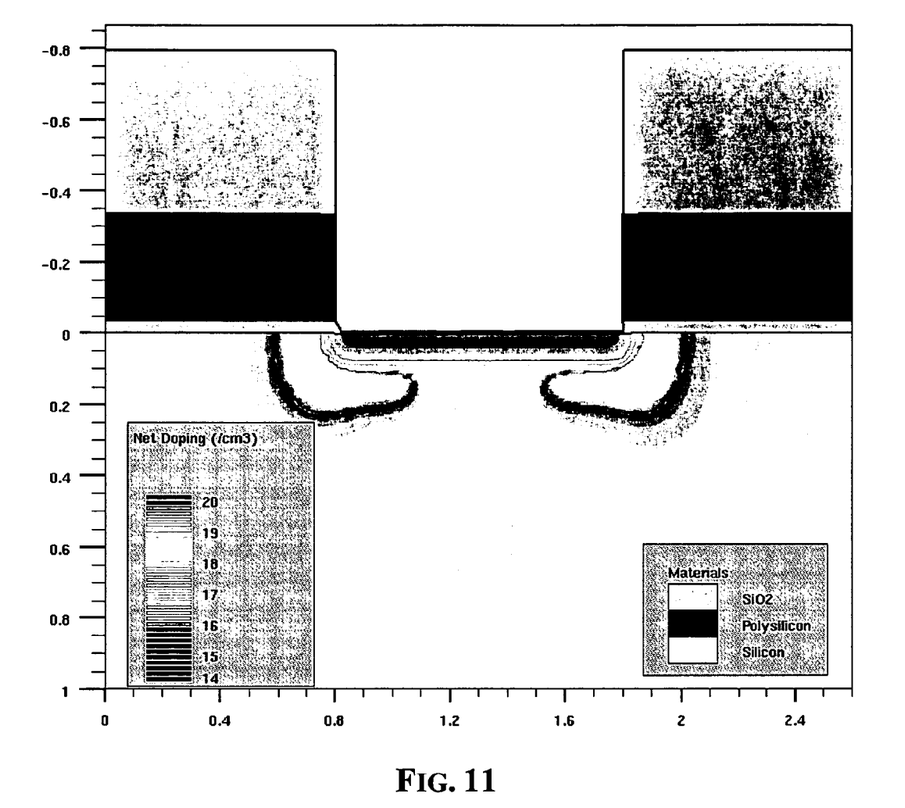
Figure 12:
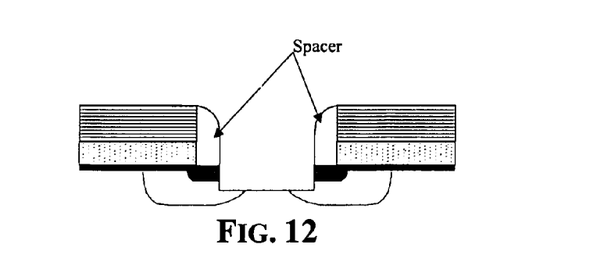
Figure 13:
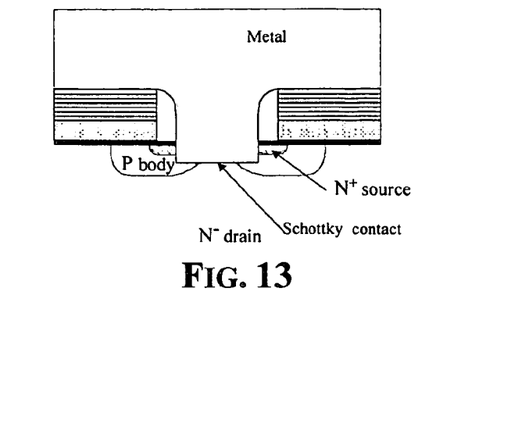
Figure 14:
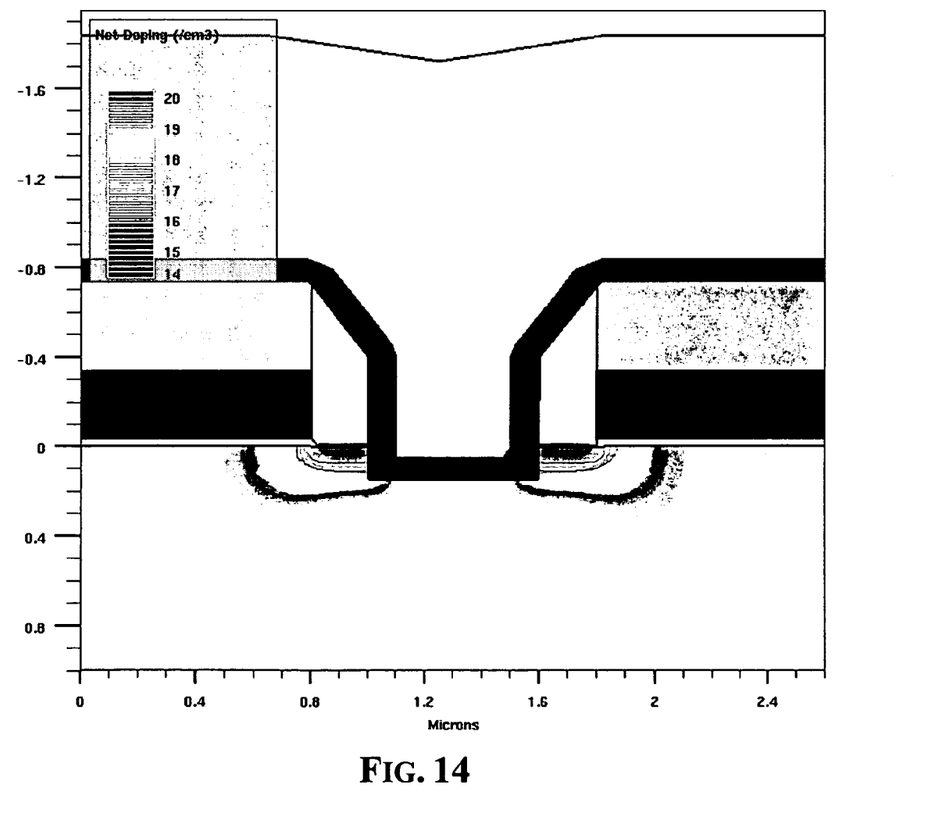
Figure 15:
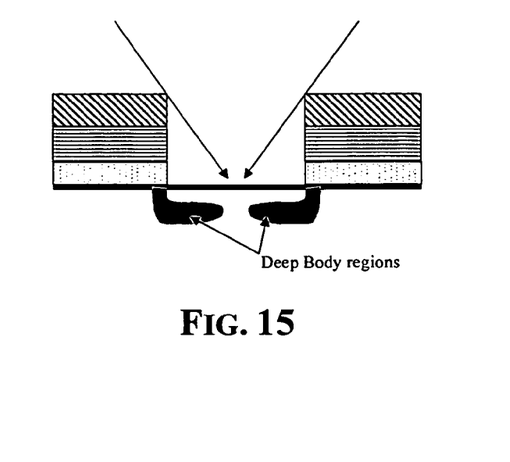
Figure 16:
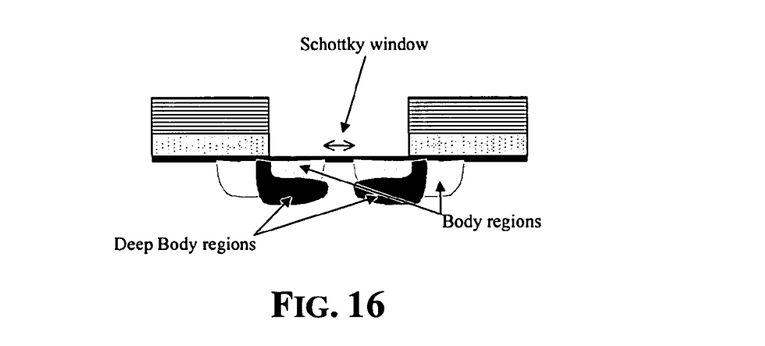
Figure 17:
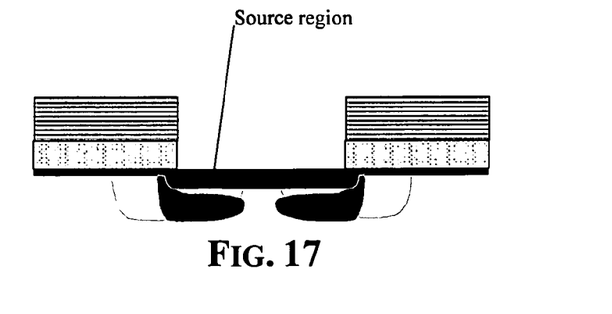
Figure 18:
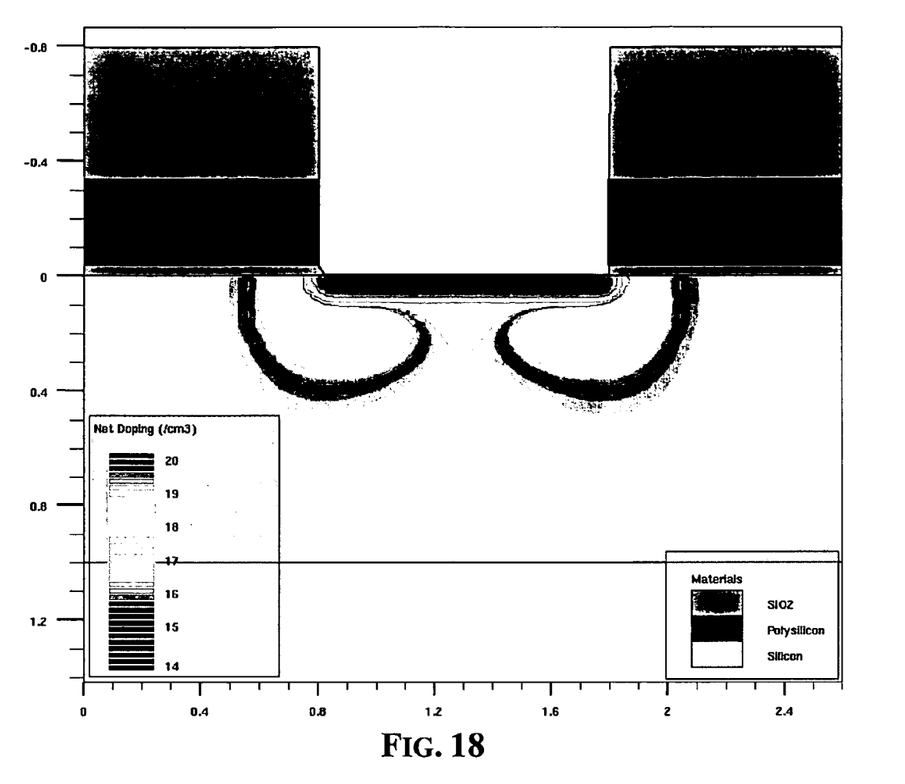
Figure 19:
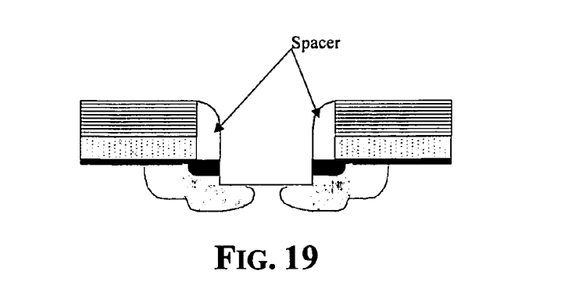
Figure 20:
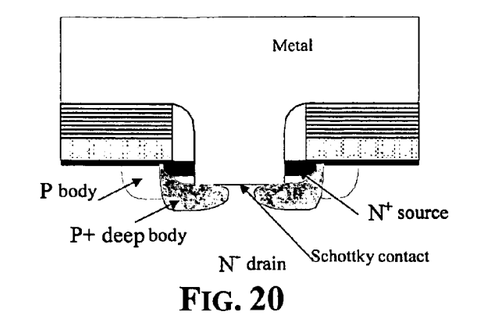
Figure 21:
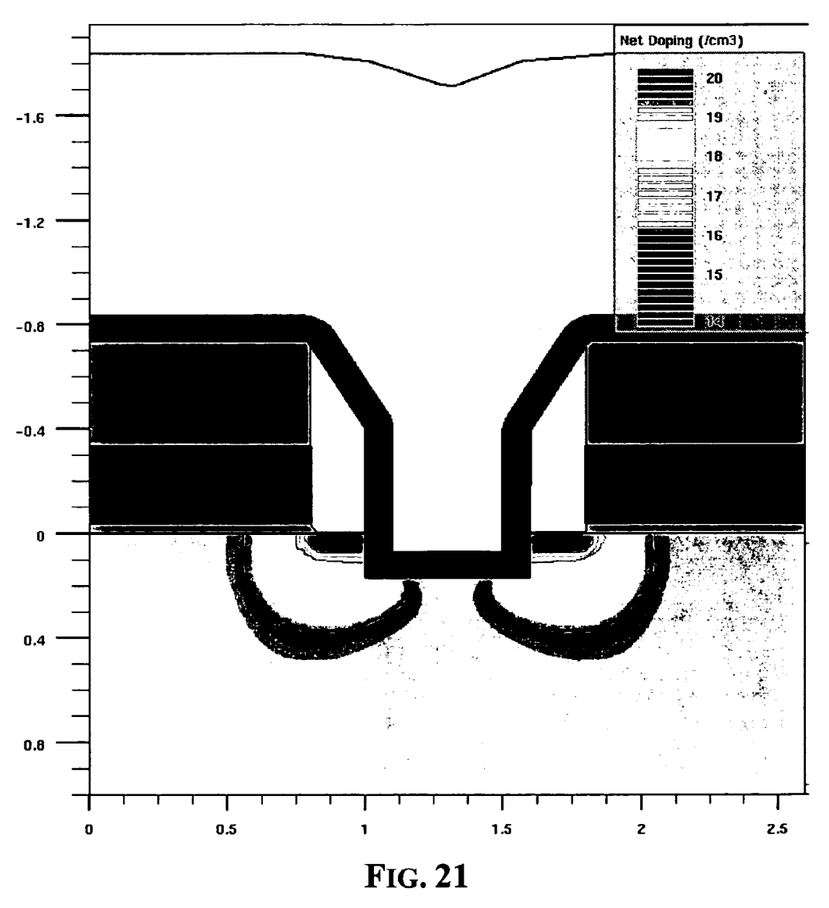

A more efficient solution, depicted in FIG. 4, consists in "distributing" the Schottky diode uniformly over the whole active area of the PMOS by integrating it in the elementary cells of the MOS. It has been demonstrated that by using a uniform distribution of Schottky diodes, it is possible to improve the dynamic performances (trr and softness) while using a reduced total area dedicated to the diode.

A solution of this kind, for low voltages devices, is disclosed in the U.S. Pat. No. 5,886,383.

According to the technique described in the patent, a Schottky diode is realized in the elementary cell of the MOSFET by a dedicated step of photolithography for realizing a Schottky diode through a certain aperture produced through a first deposited polysilicon layer, that is in the area destined to the realization of the integrated structure of an elementary cell of the insulated gate power device and on which the relative source contact will be established.

Commonly, Schottky diodes are realized by contacting with a metal layer the monocrystalline semiconducting substrate, the doping level of which determines the voltage class. In order to improve electric characteristics (leakage and breakdown voltage) when not conducting, it is well known the technique of forming, around the Schottky contact region in the semiconductor, a more or less dense array of juxtaposed diffuse regions (tubs) of opposite type of conductivity to that of the substrate (Lateral Merged PiN Schottky). The distance of separation among adjacent tubs is chosen so that under conditions of inverse polarization, the electric field is partially shielded by the depleted zones that form around the tubs.

Summarizing, in order to co-integrate Schottky diodes within the cellular structure of a power MOS there are two different approaches:

1) Schottky diode formed in dedicated areas inside the power MOS. In this case, areas more or less distributed are defined within the active area of the MOS structure, on which a Schottky contact is realized through the process steps that are done for realizing the integrated MOS structure. As explained before, in order to limit leakage current, the Schottky diode contact is surrounded by diffusions of opposite type of conductivity to that of the semiconductor crystal for shielding the electric field that is created under inverse polarization. The shielding diffusions may be realized by the same body implant of the MOS or by a dedicated implant step.

2) Schottky diode integrated in the single elementary cells that constitute the power MOS. Even if more efficient, this approach is little used because it imposes layout restraints severely limiting the possibility of increasing the packing density. The known techniques, such as the technique described in the above mentioned U.S. Pat. No. 5,886,383, require the realization of an island (51 of FIG. 4) of oxide or photoresist within an aperture produced through the polysilicon layer (poly). This limits the possibility of reducing the width of the aperture and represents an obstacle to increase the packing density of the elementary cells of the integrated structure of the power device. The shielding diffusions of the Schottky diode must necessarily be realized with the same implant step of the body of the MOS.

SUMMARY

There exists the need of integrating a Schottky diode in an elementary cell of an integrated structure of an insulated gate power device without limiting the possibility of reducing the dimensions (scaling down) of the elementary cell apart from the resolution of the photo-exposition equipment and the precision of localization of the dopants implanted in the semiconducting substrate crystal of the available fabrication technology.

A further aspect of the present invention is that of limiting the number of photolithographic steps in the sequence of process steps of an insulated gate integrated power device with co-integrated Schottky diode in parallel thereto.

The above mentioned aspects and other important advantages are obtained with the fabrication process and the integrated structure according to the disclosed embodiments of the present invention.

According to an embodiment of the present invention, the photolithographic step for defining the Schottky contact area inside the aperture of a discrete or of an elementary cell of an integrated structure of the insulated gate power device, is eliminated by carrying out:

1) an ion implantation of dopants for realizing a diffused body region with appropriate tilt and twist angles through the cell aperture formed in the layer of polysilicon deposited beforehand;
2) an ion implantation of dopants for realizing a source diffusion on the whole area of the aperture through the polysilicon; and
3) formation of a spacer along the lateral walls of the cell aperture through the polysilicon to define the anisotropic etching area of the semiconductor crystal.

In practice, an embodiment of the invention provides a method for integrating a Schottky contact inside the apertures of the elementary cells that constitute the integrated structure of the insulated gate power device in a totally self-alignment manner without requiring a dedicated masking step. This overcomes the above indicated limits to the possibility of increasing the packing density of the cellular structure of the integrated power device, while permitting improved performances of the co-integrated Schottky diode under inverse polarization of the device and producing other advantages that will be mentioned in the ensuing description.

A planar integrated insulated gate power device with high packing density of the elementary cells that compose it, having a Schottky diode electrically in parallel to the co-integrated device in each cell area defined by an aperture produced through a gate polysilicon layer deposited beforehand and that is insulated from the underlying semiconductor crystal by a dielectric gate layer, and through which the integrated structure and the respective source contact of an elementary cell is constituted, has an elementary cell structure that comprises, on the surface of the semiconducting substrate single crystal, an implanted and diffused body region and an invertible channel region under the insulated gate electrode constituted by the polysilicon layer, for establishing inversion conditions in said channel region. An implanted and diffused source region is formed in the cell area within the body region. A drain region of the semiconductor substrate is coupled to the invertible channel region and the current is eventually collected through a drain contact.

According to an embodiment of this invention, a trench is formed, in self-alignment to spacers formed on definition edge surfaces of the aperture, in the semiconductor crystal in a portion of the area of the aperture that includes a central "window" that is defined in a shade pattern by purposely implanting with different tilt and twist angles the body dopants, for a depth extending from the crystal surface through the source region and the body region that surrounds the central zone of said window not implanted with the body dopants, reaching down into the drain semiconductor under the source diffusion in correspondence of said window. A deposited metal layer contacts on at least a portion of the side walls of the trench, the source, and the body region, constituting a source contact, and, on the bottom of the trench, the drain semiconductor substrate thus establishing a Schottky contact with the drain region, electrically in parallel to the insulated gate device.

In other words, said trench is formed in a central zone of the area of the cell aperture and of the diffused body region, for a depth sufficient to reach into the semiconductor beyond the bottom profile of the source diffusion, that is in a region electrically coinciding with the drain region and surrounded by the diffused body region. The source contact metallization fills the trench establishing an electric contact with the source region and with the body region on at least a portion of the surface of the side walls of the trench and a Schottky contact on at least a portion of the bottom surface of the trench.

According to an alternative embodiment of this invention, the structure further comprises a diffused deep body region, more heavily doped than the first diffused body region that is contained therein. This second or deep body region besides containing the first body region, extends for a greater depth than the first body region surround a deeper zone under the Schottky contact established on the bottom of the trench.

According to yet another alternative embodiment of this invention, the structure further comprises a buried region having the same type of conductivity of the first body region, geometrically located in the semiconductor crystal at a certain depth under the Schottky contact established on the bottom of the trench and surrounded by a deep body region and/or by the body region.

The invention and the various embodiments thereof are more precisely defined in the annexed claims and the detailed description, respectively.

BRIEF DESCRIPTION OF THE DRAWINGS

The different aspects and advantages of this invention will appear even more evident through the following description of several alternative embodiments and referring to the attached drawings wherein.

FIGS. from 5 to 14 illustrate the relevant steps of a process of fabrication of an insulated gate power device and characteristics of the structure that is realized, according to a first embodiment of this invention.

FIGS. from 15 to 21 illustrate the relevant steps of a process of fabrication and characteristics of the structure that is realized, according to an alternative embodiment of this invention.

FIGS. from 23 to 29 illustrate the relevant steps of a process of fabrication and characteristics of the structure that is realized, according to a third alternative embodiment of this invention.

DETAILED DESCRIPTION

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

Making reference to the FIGS., the integrated structure of this invention and the way in which it may be realized according to embodiments of this invention will be described herein below.

Basically, the process of this invention differs from the known processes for the realization of a structure of an insulated gate device with Schottky diode integrated in the elementary cells that compose the device, because of the way in which the elementary cell structure is realized such to include a Schottky contact between the source metal layer and a region of semiconductor crystal of substrate electrically coinciding with the drain of the integrated power device.

The process steps that characterize embodiments of the invention may be introduced in any process flow for the fabrication of an integrated floating gate power device, such as a power MOS or briefly PMOS. For this reason, specific dimensional details of structural features and relative doses and implantation energies of the dopants are not indicated, given that these may vary from one process to another depending on fabrication technology, particular needs and/or preferences of the manufacturer.

Moreover, only for illustrating purposes, the realization of an N-channel PMOS is shown, though it is intended that the structure of this invention may also be that of a P-channel floating gate device, by simply inverting, in a dual mode, the type of conductivity of the semiconducting crystal substrate and of the dopants used for realizing the various diffused regions.

Basic process sequence (FIGS. 5 to 14)
1. realization of the drain semiconducting substrate and of the edge structure of the integrated insulated gate power device according to any known process;
2. realization of the insulated gate according to any known process (growth or deposition of a dielectric gate oxide film and deposition thereon of a conducting layer of polycrystalline silicon (polysilicon));
3. covering of the conducting gate electrode layer of polysilicon with an insulating layer of a dielectric material (for example a layer of 0.5 µm of LTO);
4. covering with photosensitive material of appropriate thickness (for example a layer of 1.5 µm of a photoresist);
5. definition of the gate electrode of polysilicon by photolithography of the layer photoresist followed by selective anisotropic etching first of the insulating layer and then of the polysilicon (on grounds of expediency a stripe cellular layout may be preferable (that is each cell is defined in the form of a short segment of a definition line, but of course this embodiment of the invention may be practiced with any other type of cellular layout);
6. ion implantation (first body implant) with appropriate tilt and twist angles of a P type dopant (for example boron or indium with 30° tilt and 90° twist). The tilt angle must be chosen such to create a shade zone by the windows opened by the anisotropic (vertical) etching in the stack composed of the polysilicon layer and the insulating layer. The tilt angle to be used will depend from the total height of the etched edge of the hard mask formed by the polysilicon the insulating layer and eventually also of the residual thickness of the photo resist mask, and from the width of the stripes or definition lines. The twist angle must be such to make the impinging ion beam orthogonal to the long side of the stripe segments. The implant dose and energy will be chosen such to obtain the desired concentration and channel length;
7. ion implantation (second body implantation) of the same P type dopant but with tilt and twist angles opposite to the ones of the preceding implantation step (for example boron or indium with −30° tilt and 90° twist or 30° tilt and −90° twist);
8. removing of the mask of photoresist;
9. activation of the body dopants (for example, 30 seconds in oven at 1100° C.);
10. ion implantation (source implant) of a N type dopant (for example 1015 ions/cm2 of arsenic with an implant energy of about 80 keV);
11. activation of the source dopant (for example, 30 seconds in oven at 1100° C.);
12. covering with one or more layers of a dielectric insulating material deposited in a sufficient conformal mode on the cell area definition steps;
13. anisotropic (vertical) etching of the layer of insulating material deposited for forming a spacer over the definition edges of the cell area stripes;
14. anisotropic (vertical) etching of the silicon for a depth deeper than the depth of the doped source region but shallower than the depth of the doped body regions. The so realized microtrench exposes within the area of each cell of the integrated structure of the PMOS, silicon surfaces of the doped source regions, the doped body regions and at the bottom of the trench also the surface of the silicon of substrate between the body diffusions, that coincides electrically with the drain of the PMOS;
15. opening by means of a dedicated photolithography of the gate contacts;

16. metallization of the front side of the wafer with a material capable of establishing a good electrical contact with said exposed surfaces of the body and source diffusions and a good barrier height of the Schottky contact that is established at the bottom of the trench with the silicon of substrate, that is with the drain of the integrated structure of the insulated gate power device (suitable materials may be for example titanium or a suicide thereof;
17. finishing of the front side and of the rear side according to the common fabrication process.

Even if it is possible to realize the body regions with only two tilted implantations, it may happen that the charge under the source be insufficient in certain particular applications to prevent the turning on of the parasitic transistor that is created by the source/body/drain junctions.

In order to increase robustness, it is advisable for certain applications to perform a second pair of tilted implantations for enriching the body zones under the source, in practice realizing a second or deep body diffused region.

Process sequence with formation of an additional deep body region (FIGS. 15 to 21)

1. realization of the drain semi conducting substrate and of the edge structure of the integrated insulated gate power device according to any known process;
2. realization of the insulated gate according to any known process (growth or deposition of a dielectric gate oxide film and deposition thereon of a conducting layer of polycrystalline silicon (polysilicon));
3. covering of the conducting gate electrode layer of polysilicon with an insulating layer of a dielectric material (for example a layer of 0.5 μm of LTO);
4. covering with photosensitive material of appropriate thickness (for example a layer of 1.5 μm of a photo resist);
5. definition of the gate electrode of polysilicon by photolithography of the layer photo resist followed by selective anisotropic etching first of the insulating layer and then of the polysilicon (on grounds of expediency a stripe cellular layout may be preferable (that is each cell is defined in the form of a short segment of a definition line, but of course the invention may be practiced with any other type of cellular layout);
6. ion implantation (first deep body implantation) with appropriate tilt and twist angles of a P type dopant (for example boron or indium with 20° tilt and 90° twist). The tilt angle must be chosen such to create a shade zone in the windows opened by the anisotropic (vertical) etching through the stack composed of the polysilicon layer and the insulating layer. The tilt angle to be used will depend from the total height of the etched edge of the mask formed by the polysilicon layer, the insulating layer and the residual thickness of the photo resist mask, and from the width of the stripes or definition lines. The twist angle must be such that the ionic stream be orthogonal to the long side of the stripes. The dose and the implant energy must be chosen such to obtain the desired concentration;
7. ion implantation (second deep body implant) of the same P type dopant but with tilt and twist angles opposite to those of the preceding implantation step (for example boron or indium with −20° tilt and 90° twist or 20° tilt and −90° twist);
8. removing of the mask of photo resist;
9. ion implantation (first body implant) with appropriate tilt and twist angles of a P type dopant (for example boron or indium with 40° tilt and 90° twist). The tilt angle must be chosen such to create a shade zone by the windows opened by the anisotropic (vertical) etching in the stack composed of the polysilicon layer and the insulating layer. The tilt angle to be used will depend from the total height of the etched edge of the hard mask formed by the polysilicon the insulating layer and from the width of the stripes or definition lines. The twist angle must be such to make the impinging ion beam orthogonal to the long side of the stripe segments. The implant dose and energy will be chosen such to obtain the desired concentration and channel length;
10. ion implantation (second body implantation) of the same P type dopant but with tilt and twist angles opposite to those of the preceding implantation step (for example boron or indium with −40° tilt and 90° twist or 40° tilt and −90° twist);
11. activation of the dopants (for example, 30 seconds in an oven at 1100° C.);
12. ion implantation (source implant) of a N type dopant (for example 1015 ions/cm2 of arsenic with an implant energy of 80 keV);
13. activation of the source dopant (for example, 30 seconds in oven at 1100° C.);
14. covering with one or more layers of a dielectric insulating material deposited in a sufficient conformal mode on the cell area definition steps;
15. anisotropic (vertical) etching of the layer of insulating material deposited for forming a spacer over the definition edges of the cell area stripes;
16. anisotropic (vertical) etching of the silicon for a depth deeper than the depth of the doped source region but shallower than the depth of the doped body regions. The so realized micro trench exposes within the area of each cell of the integrated structure of the PMOS, silicon surfaces of the doped source regions, the doped body regions and at the bottom of the trench also the surface of the silicon of substrate between the body diffusions, that coincides electrically with the drain of the PMOS;
17. opening by means of a dedicated photolithography of the gate contacts;
18. moralization of the front side of the wafer with a material capable of establishing a good electrical contact with said exposed surfaces of the body and source diffusions and a good barrier height of the Schottky contact that is established at the bottom of the trench with the silicon of substrate, that is with the drain of the integrated structure of the insulated gate power device (suitable materials may be for example titanium or a silicate thereof;
19. finishing of the front side and of the rear side according to the common fabrication process.

Figure 22:
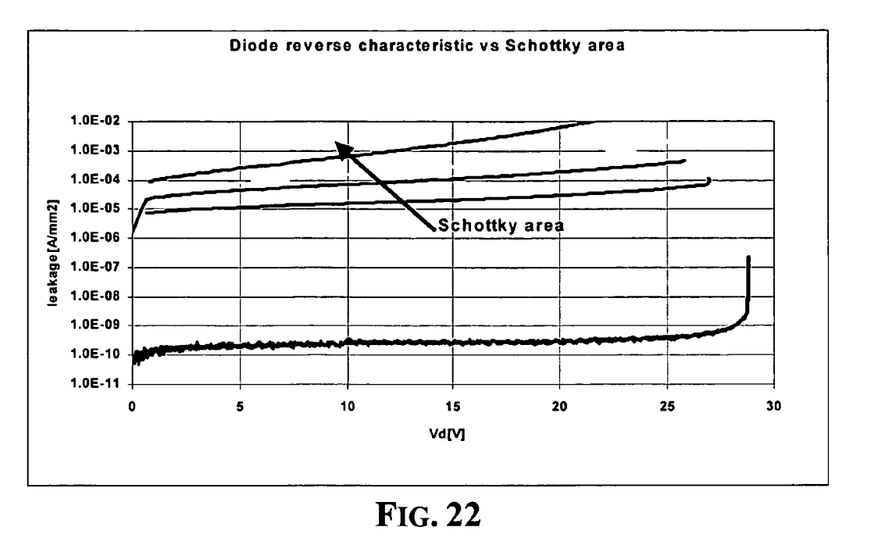
FIG. 22 shows leakage characteristics under inverse polarization in function of the area of the Schottky contact in the embodiments of FIGS. 5-14 and 15-21.
Figure 23:
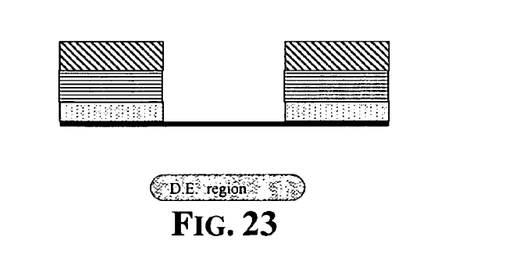
Figure 24:
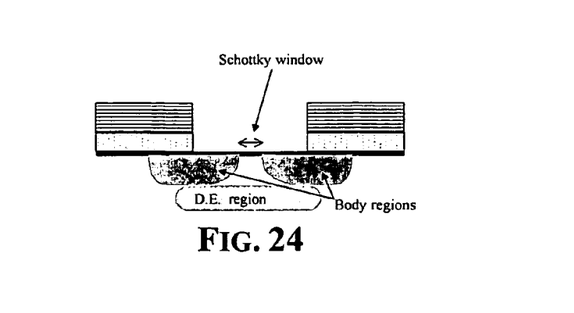
Figure 25:
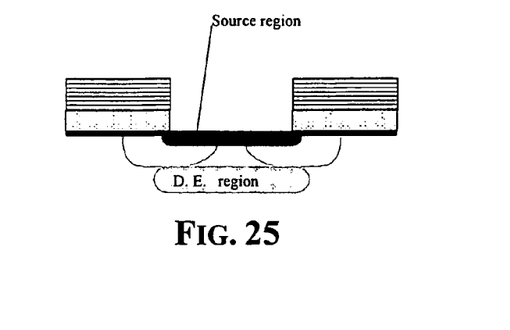
Figure 26:
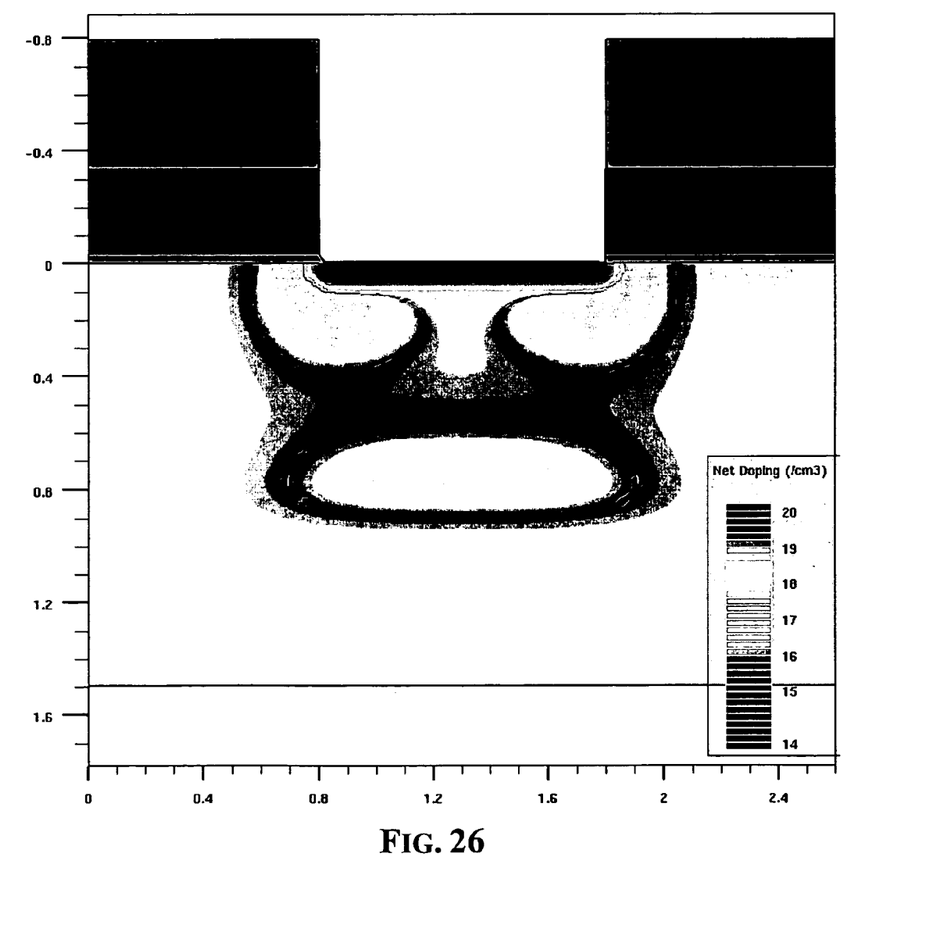
Figure 27:
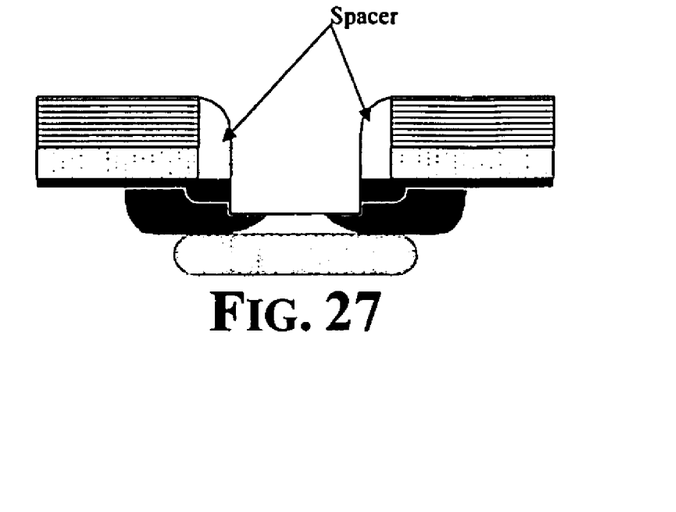
Figure 28:
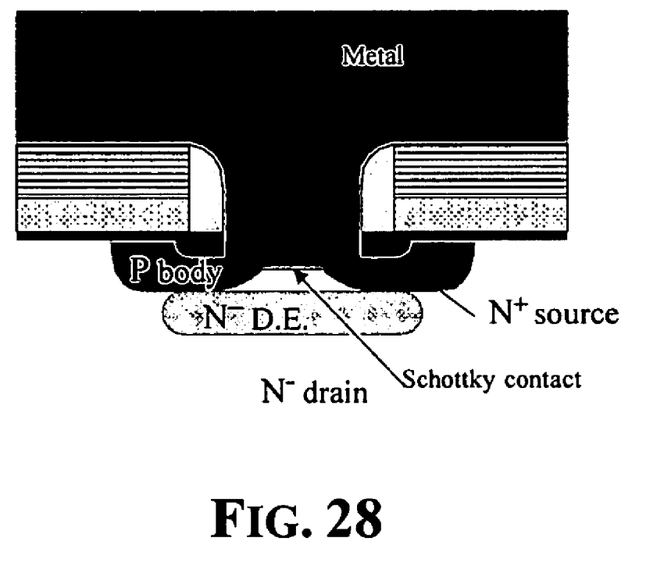
Figure 29:
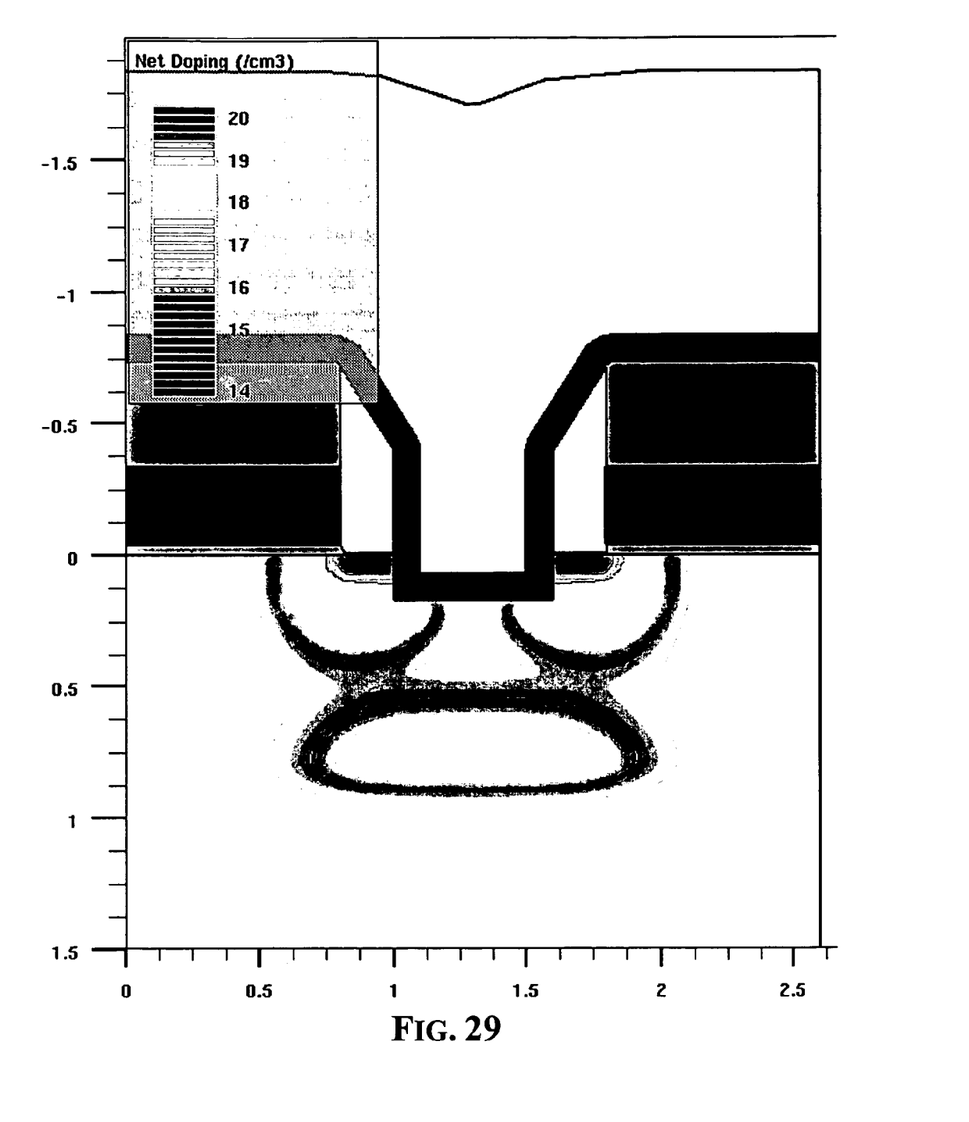

It has been noticed that the presence of a Schottky contact sensibly worsen the reverse bias electrical characteristics of the integrated device. As may be observed from the characteristics of FIG. 22, the leakage current varies by orders of magnitude in function of the percentage of cell area that is dedicated to the Schottky contact.

In order to reduce the adverse effect on the leakage current of the presence of a co-integrated Schottky diode, according to an optional embodiment of this invention, an implantation (which hereinafter will be referred to as "drain engineering" or D.E.) is included in the process sequence for increasing the resistivity of the semiconductor of substrate (drain) of the device under the Schottky contact region.

Of course, the semiconductor substrate or drain may be in practice an expitaxial layer grown on a semiconductor crystal that may have electrical characteristics different from those of the epitaxial layer grown thereon.

An implanted buried region of "drain engineering" will be electrically tied to the body or, where they exists, to the deep body diffusions, such to effectively shield the Schottky contact also in a vertical direction, with the result of decisively reducing the leakage current.

According to this optional embodiment, the realized integrated structure may be defined as "Lateral & Vertical Merged PiN Schottky (LVMPS)".

Process sequence with buried region of "drain engineering" (FIGS. 23 to 29)

Figure 30:
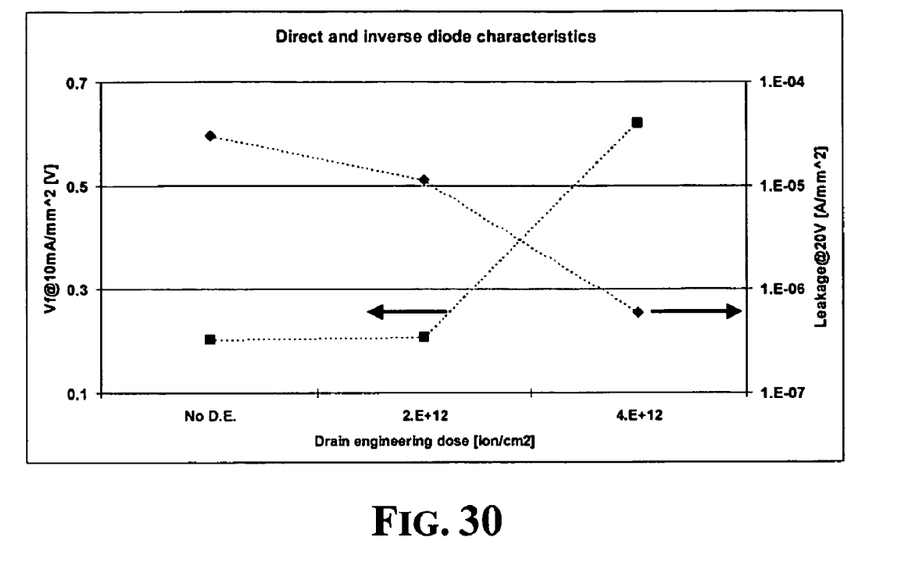
FIG. 30 shows the inverse leakage and the direct voltage drop performances in function of the characteristics of a shielding buried region of the Schottky contact in the embodiment of FIGS. 23-29.

1. realization of the drain semiconducting substrate and of the edge structure of the integrated insulated gate power device according to any known process;
2. realization of the insulated gate according to any known process (growth or deposition of a dielectric gate oxide film and deposition thereon of a conducting layer of polycrystalline silicon (polysilicon));
3. covering of the conducting gate electrode layer of polysilicon with an insulating layer of a dielectric material (for example a layer of 0.5 μm of LTO);
4. covering with photosensitive material of appropriate thickness (for example a layer of 1.5 μm of a photo resist);
5. definition of the gate electrode of polysilicon by photolithography of the layer photo resist followed by selective anisotropic etching first of the insulating layer and then of the polysilicon (on grounds of expediency a stripe cellular layout may be preferable (that is each cell is defined in the form of a short segment of a definition line, but of course the invention may be practiced with any other type of cellular layout);
6. ion implantation (Drain Engineering implant) at high energy of a P type dopant (for example boron at 200-400 keV). The dose to be implanted must be such to compensate slightly the epitaxial layer and it is thus a function of the voltage class of the power device being fabricated;
7. ion implantation (first body implant) with appropriate tilt and twist angles of a P type dopant (for example boron or indium with 30° tilt and 90° twist). The tilt angle must be chosen such to create a shade zone by the windows opened by the anisotropic (vertical) etching in the stack composed of the polysilicon layer and the insulating layer. The tilt angle to be used will depend from the total height of the etched edge of the hard mask formed by the polysilicon the insulating layer and eventually also of the residual thickness of the photo resist mask, and from the width of the stripes or definition lines. The twist angle must be such to make the impinging ion beam orthogonal to the long side of the stripe segments. The implant dose and energy will be chosen such to obtain the desired concentration and channel length;
8. ion implantation (second body implant) of the same P type dopant but with tilt and twist angles opposite to those of the preceding implantation (for example boron or indium with −30° tilt and 90° twist or 30° tilt and −90° twist);
9. removing of the mask of photo resist;
10. activation of the body dopants (for example, 30 seconds in oven at 1100° C.);
11. ion implantation (source implant) of a N type dopant (for example 1015 ions/cm2 of arsenic with an implant energy of about 80 keV);
12. activation of the source dopant (for example, 30 seconds in oven at 1100° C.);
13. covering with one or more layers of a dielectric insulating material deposited in a sufficient conformal mode on the cell area definition steps;
14. anisotropic (vertical) etching of the layer of insulating material deposited for forming a spacer over the definition edges of the cell area stripes;
15. anisotropic (vertical) etching of the silicon for a depth deeper than the depth of the doped source region but shallower than the depth of the doped body regions. The so realized micro trench exposes within the area of each cell of the integrated structure of the PMOS, silicon surfaces of the doped source regions, the doped body regions and at the bottom of the trench also the surface of the silicon of substrate between the body diffusions, that coincides electrically with the drain of the PMOS;
16. opening by means of a dedicated photolithography of the gate contacts;
17. moralization of the front side of the wafer with a material capable of establishing a good electrical contact with said exposed surfaces of the body and source diffusions and a good barrier height of the Schottky contact that is established at the bottom of the trench with the silicon of substrate, that is with the drain of the integrated structure of the insulated gate power device (suitable materials may be for example titanium or a silicate thereof);
18. finishing of the front side and of the rear side according to the common fabrication process. ps Advantages:

a) the composite basic cell structure MOS+Schottky of this invention is realized without any additional dedicated masking step. The width of the stripes is thus limited only by the resolution of the photoexposition equipment and by the ability to precisely implant the dopants (to this end it is convenient to use dopants with low diffusivity such as indium and arsenic);

b) by carrying out a process flow that contemplates the formation of an additional buried drain engineering region, a reduction of the leakage current of even an order of magnitude may be achieved while retaining all advantages under direct bias (FIG. 30).

Though embodiments of the invention have been illustrated for the case of fabrication of a N channel PMOS, the invention can be practiced also for fabricating a P channel PMOS, by inverting the types of dopants.

Of course, the use of a stripe layout is not mandatory, other cellular layouts may be used, eventually performing several pairs of body implantations each with appropriate tilts and twist angles in order to realize the body diffusions in each channel zone while defining a Shoitky contact window there between.

The formation of a self-aligned Schottky contact in a "window" defined by the use of angled implantations in the middle of the cell area, may be extended even to a structure with traditional contacts (that is defined and opened by photolithography). In this case the etching of silicon for forming the microtrench will not be self-aligned to the window opened by photolithography through the polysilicon, but self-aligned to the contact openings.

Even the concept of "Lateral & Vertical Merged PiN Schottky (LVMPS)", that is the introduction of an implantation (buried region) under the lateral body diffusions and under the Schottky contact region, for modifying locally the doping profile of the drain, may be extended also to Schottky diodes that are not co-integrated in the elementary cells of the integrated power device, but realized in dedicated areas.

The graph of FIG. 30 shows the leakage current and the direct voltage drop obtained on test structures for different doses of drain engineering dopant. Near the dose of 2*1012 ions/cm2 there is enough room for reducing the leakage by an order of magnitude without burdening excessively the direct voltage drop. By doubling the dose, the drain engineering diffusion creates a junction that shields the Schottky contact but reduces the direct characteristic to become practically similar to that of a PN junction diode.

The insulated gate planar power devices according to the above embodiments may be used in a variety of different types of electronic systems, such as a DC-DC converter and other types of rectifying systems.

Even though various embodiments and advantages of the resent invention have been set forth in the foregoing description, the above disclosure is illustrative only, and changes may be made in detail and yet remain within the broad principals of the present invention. Therefore, the present invention is to be limited only by the appended claims.

The invention claimed is:

1. A process for fabricating an insulated gate integrated power device comprising the operations of:
   a) constituting a drain semiconducting substrate doped with a dopant of a first type of conductivity and forming an edge structure of the insulated gate integrated power device,
   b) forming an insulated gate electrode by growing or depositing a dielectric film of gate oxide on the surface of said drain semiconducting substrate and depositing thereon a conductive layer of polysilicon,
   c) covering said conductive polysilicon layer with an insulating layer or multilayer of dielectric material deposited thereon,
   d) depositing a layer of photo resist on said deposited insulating layer,
   e) defining said gate electrode by masking and anisotropic selective etching of said deposited insulating layer and of said polysilicon layer forming apertures through the area of which the integrated structure and the relative source contact of each elementary cell constituting said power device will be formed, and wherein the successive sequence comprises the operations of:
   f) performing a first ion implantation of a dopant appropriate to constitute a body region of opposite type of conductivity of said drain semiconducting substrate with certain tilt and twist angles such to determine a shade zone inside said aperture in function of the total height of the definition edge of the stack composed of said polysilicon layer, said insulating layer and said layer of photo resist, and of the width of the aperture, with an implant dose and energy appropriate to obtain a certain concentration and channel length;
   g) performing at least a second ion implantation at the same conditions of said first implantation but with different tilt and twist angles to define a central window in the shade pattern on the implanted cell area;
   h) removing of said layer of photo resist;
   i) activating the implanted dopants by heat treatment;
   j) performing a source ion implantation on the whole area of said aperture of a dopant of the same type of conductivity of the drain substrate and opposite to that of the dopant of said body implantations with dose and energy of implant appropriate to constitute a source region surrounded by said body region;
   k) activating of the implanted source dopant by heat treatment;
   l) depositing a sacrificial layer of a dielectric material under conditions of substantial uniformity of thickness of deposition over the steps of the definition borders of said apertures;
   m) anisotropic etching of the sacrificial layer for leaving a dielectric spacer on the definition edge surfaces of said apertures;
   n) after the operations of activating of the implanted source dopant and covering, anisotropic etching of the semiconducting substrate for a depth deeper than the depth of said source region but shallower than the depth of said body region, exposing within the area of each cell surfaces of said source region, of said body region and, at the bottom of the trench, a zone of said drain substrate surrounded laterally by said body region;
   o) opening of contacts on said gate electrode through a dedicated photo resist mask;
   p) removing the photo resist mask and depositing one or more conductive metal layers for establishing inside said trench an electric contact with both the source region and the body region and determining a good barrier height of the Schottky contact established with the drain substrate on at least a portion of the bottom surface of said trench.

2. The method of claim 1 wherein the first type of conductivity is N-type and wherein the opposite type of conductivity is P-type.

* * * * *